(12) United States Patent
Kanazashi

(10) Patent No.: US 6,438,054 B1
(45) Date of Patent: Aug. 20, 2002

(54) SEMICONDUCTOR INTEGRATED CIRCUIT

(75) Inventor: Kazuyuki Kanazashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/028,428

(22) Filed: Dec. 28, 2001

Related U.S. Application Data

(62) Division of application No. 09/635,868, filed on Aug. 10, 2000, now Pat. No. 6,343,041.

(30) Foreign Application Priority Data

Dec. 9, 1999 (JP) .................................... 11-350541

(51) Int. Cl.$^7$ ................................................ G11C 7/00
(52) U.S. Cl. .................... 365/219; 365/220; 365/221; 365/239; 365/240; 365/189.12
(58) Field of Search ..................... 365/219, 202, 365/221, 239, 240, 189.01, 189.12, 78, 83

(56) References Cited

U.S. PATENT DOCUMENTS

| | | | |
|---|---|---|---|
| 4,157,458 A | * | 6/1979 | Roche .................. 179/15 A |
| 6,125,078 A | | 9/2000 | Ooishi et al. |
| 6,337,832 B1 | * | 1/2002 | Ooishi et al. ............ 365/233 |
| 6,343,041 B1 | * | 1/2002 | Kanazashi ................ 365/219 |

FOREIGN PATENT DOCUMENTS

| | | |
|---|---|---|
| JP | 59-221741 | 12/1984 |
| JP | 62-82417 | 4/1987 |

* cited by examiner

*Primary Examiner*—Viet Q. Nguyen
(74) *Attorney, Agent, or Firm*—Arent Fox Kintner Plotkin & Kahn, PLLC

(57) ABSTRACT

The semiconductor integrated circuit comprises a parallel-serial converter for converting parallel data read from memory cells into serial data and a switch control circuit for receiving a control signal and controlling the parallel-serial converter. The parallel-serial converter has a plurality of switches connected in a predetermined order. The switch control circuit controls the order of connecting the switches in accordance with the control signal so that parallel data are converted into serial data in a predetermined bit order. This minimizes delay elements formed on the transmission paths of parallel data. Specifically, for example, it eliminates the need for a conversion circuit for changing the bit order of parallel data. This results in faster data read operations from memory cells. Each of the switches in the parallel-serial converter operates in synchronization with a clock signal supplied from the exterior. This can heighten the speed of read operations, for example, in a clock-synchronous type of semiconductor integrated circuit having memory cells.

2 Claims, 8 Drawing Sheets

SEMICONDUCTOR INTEGRATED CIRCUIT

This is a Division of application Ser. No. 09/635,868 filed Aug. 10, 2000. The disclosure of the prior application is hereby incorporated by reference herein in its entirety now U.S. Pat. No. 6,343,041.

BACKGROUND OF THE INVENTION

1. Field of the Invention

The present invention relates to a semiconductor integrated circuit which transmits data in serial to/from the exterior and reads/writes data in parallel from/to memory cells. In particular, the present invention relates to a technology of converting data at high speed.

2. Description of the Related Art

SDRAMs (Synchronous DRAMs) are known as a semiconductor integrated circuit operating their input/output interfaces at high speed in synchronization with a clock signal or the like to input/output data at high speed. Their transmitting data in serial to/from the exterior and reading/writing data in parallel from/to memory cells improve its data transmission speed.

FIG. 1 shows the outlines of an output interface unit in the SDRAM of this type.

An output interface unit 1 comprises a data selector 2, a parallel-serial converter 3, a shift register 4, and a data output buffer 5. This output interface unit 1 except the shift register 4 is formed for each of a plurality of data input/output terminals DQ.

The data selector 2 comprises four switches 2a consisting of CMOS transmission gates or the like. Each of the switches 2a receives data signals DB0–DB3 output from not-shown memory cells, and outputs one of the received signals as a data signal DBS0 (DBS1, DBS2, or DBS3) in accordance with address signals AD0 and AD1. In this diagram, the data selector 2 is shown connecting its switches when the address signals AD0 and AD1 are "10" in binary.

The parallel-serial converter 3 comprises four switches 3a each consisting of CMOS transmission gates or the like. The switches 3a are turned on upon the activation of connecting signals NA, NB, NC, and ND, and respectively transmit the data signals DBS0–DBS3 as a data output signal DOUT.

The shift register 4 performs shift operations in synchronization with a clock signal CLK, activating the connecting signals NA, NB, NC, and ND in this order.

The data output buffer 5 outputs serial read data transmitted as the data output signal DOUT to the data input/output terminal DQ.

In this SDRAM, the order of outputting the data signals DBS0–DBS3 in a read operation is determined in accordance with lower address signals AD0 and AD1 supplied from the exterior. Such an operating mode that data read from memory cells in parallel are successively output is generally referred to as a burst output mode.

FIG. 2 shows an example of the read operations by the SDRAM described above.

Initially, the SDRAM accepts a read command READ 1 and address signals in synchronization with the CLK signal on the cycle 1 to start a read operation. In this example, the address signals AD0 and AD1 supplied along with the read command READ1 are "10" in binary.

The data selector 2 shown in FIG. 1 receives the address signals AD0 and AD1, and connects the switches 2a. The data signals DB0, DB1, DB2, and DB3 read from memory cells are transmitted as the data signals DBS2, DBS3, DBS0, and DBS1, respectively, through the data selector 2.

The shift register 4 activates the connecting signals NA, NB, NC, and ND in synchronization with the clock signal CLK on the cycles 3, 4, 5, and 6, respectively.

The switches 3a in the parallel-serial converter 3 receive the connecting signals NA, NB, NC, and ND, and sequentially output the data signals DBS2, DBS3, DBS0, and DBS1 as the data output signal DOUT.

Then, the data output signal DOUT of serial form is output to the data input/output terminal DQ via the data output buffer 5. That is, when the address signals AD0 and AD1 are "10," the data signals are output in the order of DB2, DB3, DB0, and DB1 (4-bit burst output).

In synchronization with the clock signal CLK on the cycle 5, the SDRAM also accepts the next read command READ2 and address signals AD0 and AD ("00" in binary).

The data selector 2 switches over the individual switches 2a according to the address signals AD0 and AD1. Then, the data signals DB0, DB1, DB2, and DB3 read from memory cells are respectively transmitted as the data signals DBS0, DBS1, DBS2, and DBS3 through the date selector 2. In synchronization with the connecting signals NA, NB, NC, and ND sequentially activated, the parallel-serial converter 3 outputs the data signals DBS0, DBS1, DBS2, and DBS3 as the serial data output signal DOUT.

Then, the serial data output signal DOUT is output to the data input/output terminal DQ via the data output buffer 5. That is, when the address signals AD0 and AD1 are "00," the data signals are output in the order of DB0, DB1, DB2, and DB3.

On the next read command READ3, the read data are output to the data input/output terminal DQ in the order of the data signals DB3, DB0, DB1, and DB2 in accordance with the address signals AD0 and AD1 ("11" in binary).

In the output interface unit 1 described above, the data signals DB0–DB3 are output to the exterior controlled by both the data selector 2 and the parallel-serial converter 3. Therefore, it is required to consider the timing margins of both the data selector 2 and the parallel-serial converter 3 in the timing design of the SDRAM.

In addition, the data signals DB0–DB3 are output to the exterior through the two switches 2a and 3a and this delays the outputs of the data signals by the propagation delay times of the switches 2a and 3a.

As described above, in conventional SDRAMs, the output interface unit 1 has caused the data transmission speed of read data from memory cells to lower. SDRAMs are essentially characterized by operating their input/output interfaces at high speed. On this account, the output interface unit 1 needs to transmit read data from memory cells as fast as possible.

SUMMARY OF THE INVENTION

An object of the present invention is to transmit read data from memory cells at high speed.

Another object of the present invention is to perform a read operation at high speed in a semiconductor integrated circuit having memory cells.

Another object of the present invention is to perform a read operation at high speed in semiconductor integrated circuit having memory cells of a clock-synchronous type.

Another object of the present invention is to control the parallel-to-serial conversion of read data with a simple circuit.

Another object of the present invention is to perform a write operation at high speed in a semiconductor integrated circuit having memory cells.

According to one of the aspects of the semiconductor integrated circuit in the present invention, the semiconductor integrated circuit comprises a parallel-serial converter for converting parallel data read from memory cells into serial data and a switch control circuit for receiving a control signal and controlling the parallel-serial converter. The parallel-serial converter has a plurality of switches selected in a predetermined order. The switch control circuit controls the order of selecting the switches in accordance with the control signal so that parallel data are converted into serial data in a predetermined bit order.

This minimizes delay elements formed on the transmission paths of parallel data. Specifically, for example, it eliminates the need for a conversion circuit for changing the bit order of parallel data. This results in faster data read operations from memory cells.

According to another aspect of the semiconductor integrated circuit in the present invention, the serial data converted by the parallel-serial converter are output to the exterior through an output circuit. This can further heighten the speed of read operations, for example, in a semiconductor integrated circuit having a burst output function.

According to another aspect of the semiconductor integrated circuit in the present invention, each of the switches in the parallel-serial converter operates in synchronization with a clock signal supplied from the exterior. This can heighten the speed of read operations, for example, in a clock-synchronous type of semiconductor integrated circuit having memory cells.

According to another aspect of the semiconductor integrated circuit in the present invention, the control signal is supplied from the exterior corresponding to a read operation in a memory cell. This makes it possible to change the bit order of serial data in real time in every read operation.

According to another aspect of the semiconductor integrated circuit in the present invention, the bit order of the serial data is changed by an address signal selecting a predetermined one of the memory cells. For example, a 1-bit address signal can be used to convert 2-bit parallel data into serial data in a predetermined bit order. A 2-bit address signal can be used to convert 4-bit parallel data into serial data in a predetermined bit order. In other words, the semiconductor integrated circuit having a burst output function can convert output data into serial data in a predetermined bit order without any delay in access time.

According to another aspect of the semiconductor integrated circuit in the present invention, the switch control circuit comprises a shift register having memory stages whose outputs are connected with the switches. The initial value of the shift register is set in accordance with the control signal. shifting the shift register enables the switches to be connected in a predetermined order. This permits control over the bit order of the serial data with a simple circuit. The simplicity of the circuit also facilitates timing design and layout design.

According to another aspect of the semiconductor integrated circuit in the present invention, the address signal for selecting a predetermined one of the memory cells is supplied from the exterior. The initial value of the shift register is set in accordance with this address signal.

Therefore, the semiconductor integrated circuit having a burst output function can convert output data into serial data in a predetermined bit order without any delay in access time.

According to another aspect of the semiconductor integrated circuit in the present invention, the shift register receives an inverting signal and inverts its shift direction in accordance with the inverting signal. Therefore, serial data in different bit orders can be generated by using the same shift register. For example, the inversion of a shift direction allows easy application of an interleave mode.

According to another aspect of the semiconductor integrated circuit in the present invention, the semiconductor integrated circuit comprises a serial-parallel converter for converting serial data to be written to memory cells into parallel data, and a switch control circuit for receiving a control signal and controlling the serial-parallel converter. The serial-parallel converter has a plurality of switches selected in a predetermined order. The switch control circuit controls the order of selecting the switches in accordance with the control signal so that serial data are converted into parallel data in a predetermined bit order.

This minimizes delay elements formed on the transmission paths of parallel data. Specifically, for example, it eliminates the need for conversion circuits for changing the bit order of parallel data. This results in faster data write operations in memory cells.

BRIEF DESCRIPTION OF THE DRAWINGS

The nature, principle, and utility of the invention will become more apparent from the following detailed description when read in conjunction with the accompanying drawings in which like par are designated by identical reference numbers, in which.

DESCRIPTION OF THE PREFERRED EMBODIMENTS

Hereinafter, the embodiments of the present invention will be described with reference to the accompanying drawings.

Figure 3:
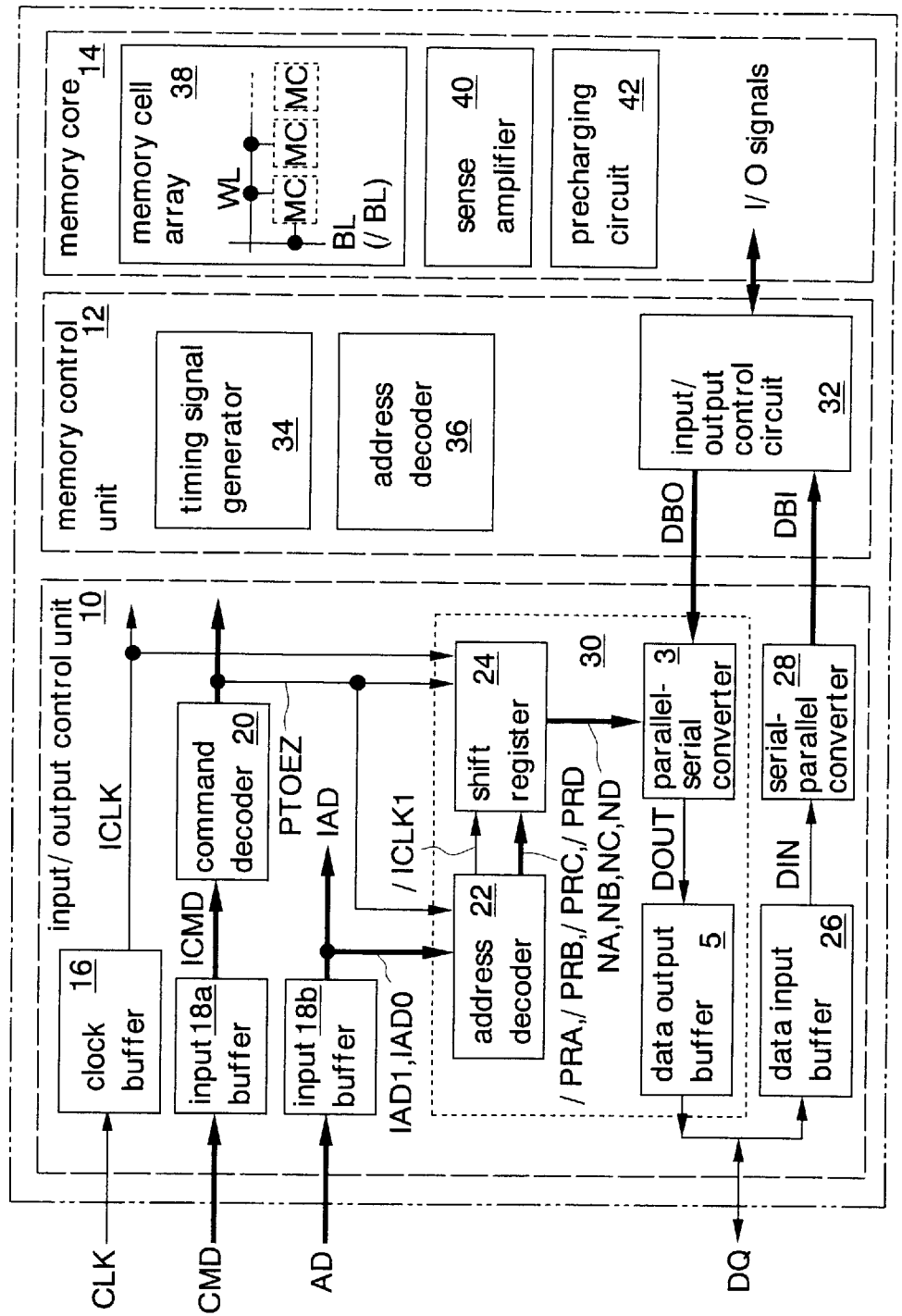
FIG. 3 a block diagram showing a first embodiment of the semiconductor integrated circuit according to the present invention.

FIG. 3 shows a first embodiment of the semiconductor integrated circuit according to the present invention. The same circuits as those described in the conventional art are designated by identical reference numbers, and detailed description thereof will be omitted here. In the following descriptions, signals may be referred to their abbreviations such as "AD signal" for "address signal AD." Moreover, signals marked with "/" are of negative logic. In the drawings, those signal lines shown by thick lines are composed of a plurality of lines. Some of the blocks connected with the thick lines consist of a plurality of circuits.

The semiconductor integrated circuit in this embodiment is formed as an SDRAM on a silicon substrate by using CMOS process technology. The SDRAM comprises an input/output control unit 10, a memory control unit 12, and a memory core 14.

Figure 1:
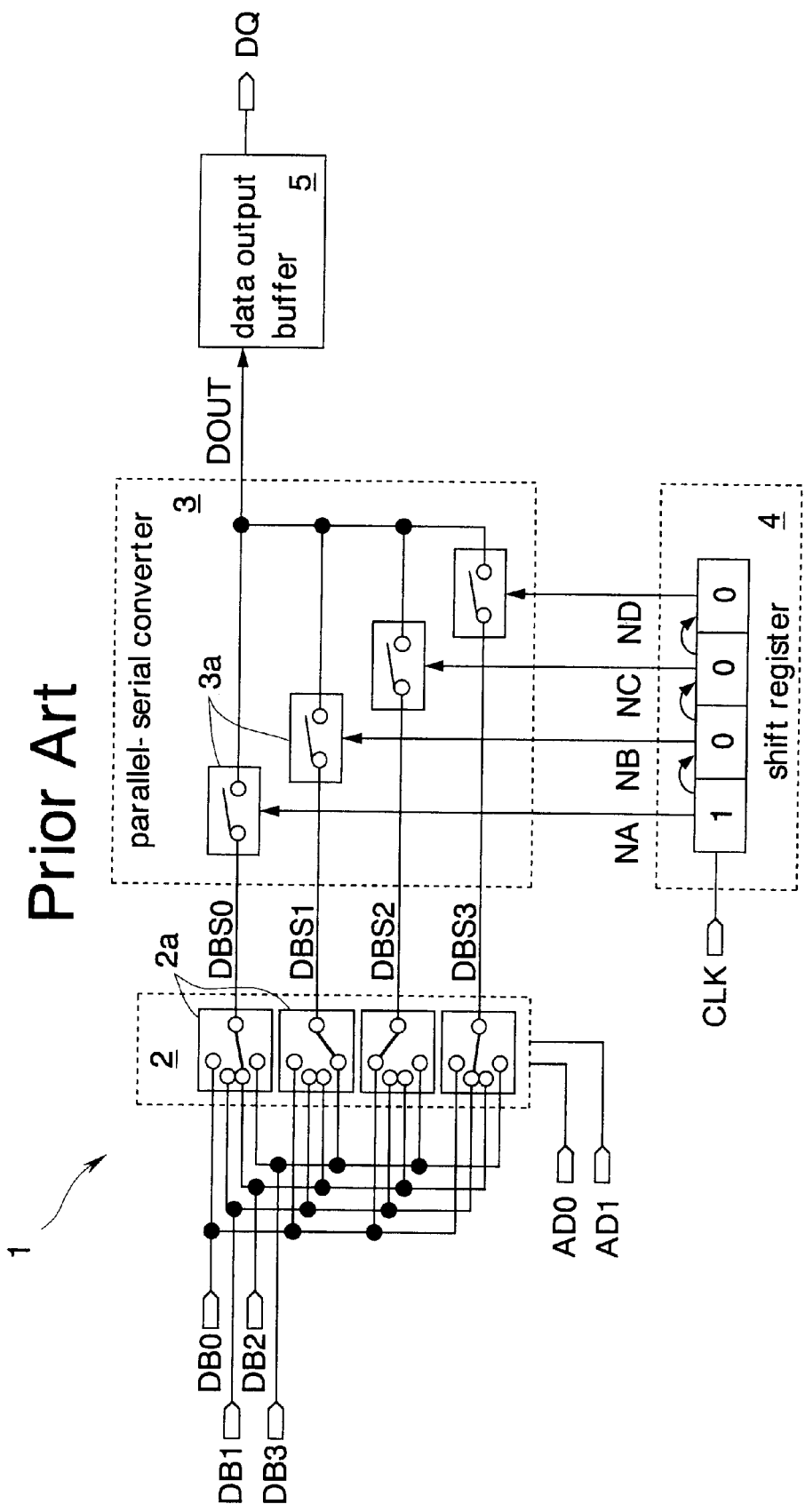
FIG. 1 is a block diagram showing the outlines of a conventional output interface unit.
Figure 2:
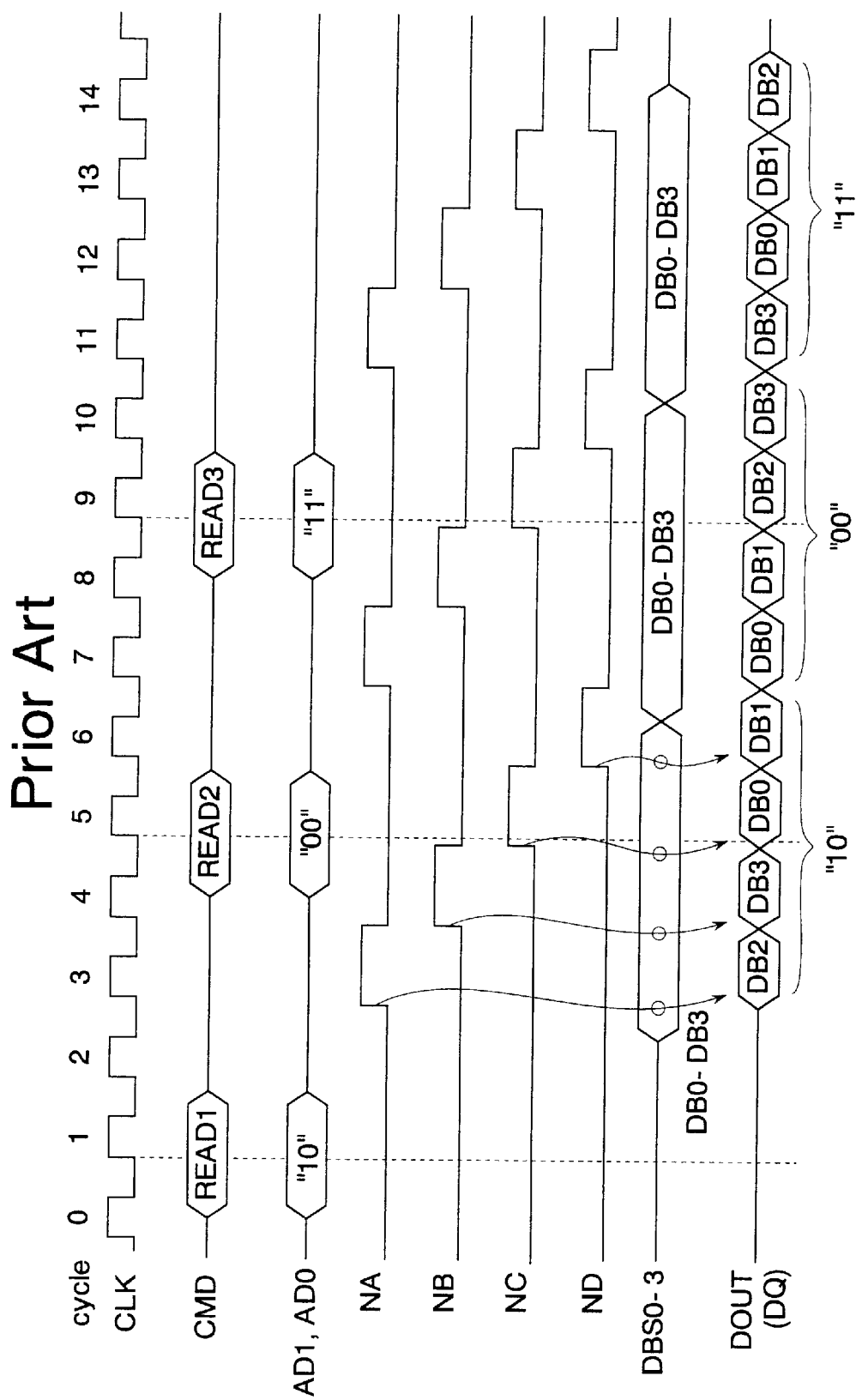
FIG. 2 is a timing chart showing conventional read operations.

The input/output control unit 10 comprises a clock buffer 16, input buffers 18a and 18b, a command decoder 20, an address decoder 22, a shift register 24, a data output buffer 5, a data input buffer 26, a parallel-serial converter 3, and a serial-parallel converter 28. Here, the address decoder 22, the shift register 24, the data output buffer 5, and the parallel-serial converter 3 is constituted as an output interface unit 30. The parallel-serial converter 3 and the data output buffer 5 are the same circuits as those of FIG. 1.

Figure 4:
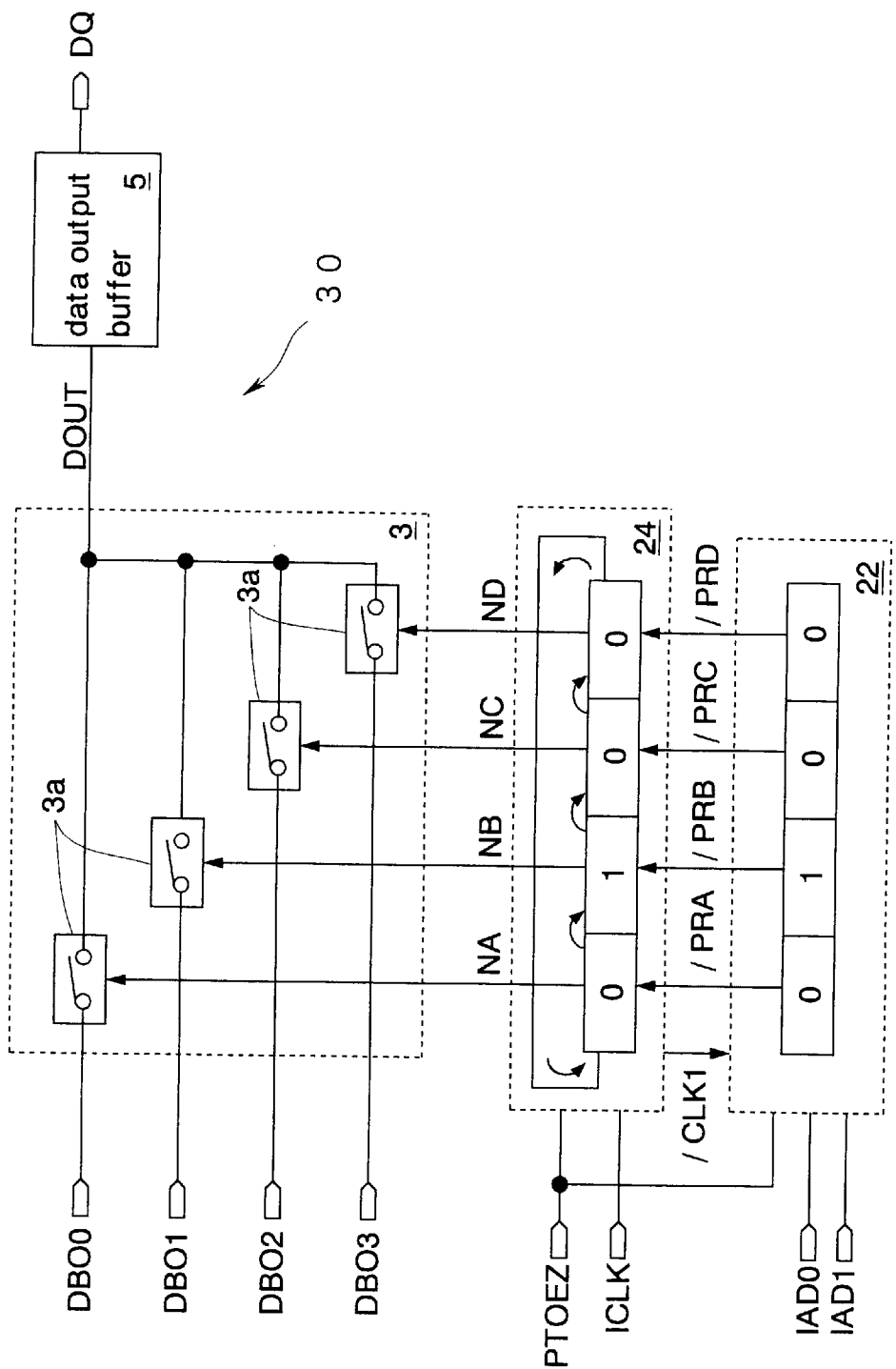
FIG. 4 is as block diagram showing the outlines of the output interface unit in FIG. 3.

FIG. 4 shows the outlines of an essential part, the output interface unit 30 according to the present invention.

The parallel-serial converter 3 has a plurality of switches 3a. The address decoder 22 and the shift register 24 operate as the control circuit of the parallel-serial converter 3.

The address decoder 22 is activated under the low level of a read controlling signal PTOEZ, and inactivated upon receiving the low level of an internal clock signal/CLK1. The address decoder 22 decodes internal address signals IAD1 and IAD0, and turns one of preset signals /PRA,/PRB,/PRC, and /PRD to low level.

The shift register 24 has 4-bit memory stages 24a for making shift operations in synchronization with an internal clock signal ICLK. The information from the final stage is fed back to the initial stage. The memory stages 24a in the shift register 24 output connecting signals NA, NB, NC, and ND for controlling the switches 3a, respectively. In addition, the memory stages 24a are preset by the preset signals/PRA, /PRB,/PRC, and /PRD. In other words, the shift register 24 is initialized in accordance with the address signals supplied from the exterior. In each shift operation, the shift register 24 sequentially activates the connecting signal NA, NB, NC, or ND.

Then, the parallel-serial converter 3 receives the connecting signals NA, NB, NC, and ND in synchronization with ICLK signal at the respective switches 3a, and converts the data output signals DB00–DB03 in parallel read from memory cells MC into the data output signal DOUT in serial. That is, the switches 3a are connected to an output node.

As shown in FIG. 3, the clock buffer 16 receives the CLK signal from the exterior, and outputs the internal clock signal ICLK. The ICLK signal is also supplied to essential circuits in addition to the ones shown in the diagram. The input buffer 18a accepts a command signal CMD in synchronization with the ICLK signal, and outputs the accepted signal as an internal command signal ICMD.

The input buffer 18b accepts an address signal AD in synchronization with the ICLK signal, and outputs the accepted signal as an internal address signal IAD.

The command decoder 20 receives the internal command signal ICMD, analyzes the command, and outputs control signals for controlling the basic operations of the chip. Here, the read controlling signal PTOEZ is activated (turned to high level) for a predetermined period when the command signal CMD corresponding to a read operation is supplied.

As described above, the address decoder 22 receives the /CLK1 signal, the PTOEZ signal, and the IAD0 and IAD1 signals, and outputs the preset signals /PRA,/PRB,/PRC, and /PRD.

The shift register 24 receives the ICLK signal, the PTOEZ signal, and the preset signals /PRA,/PRB,/PRC, and /PRD, and outputs the /CLK1 signal and the connecting signals NA, NB, NC, and ND.

The data output buffer 5, in a read operation, receives the serial data output signal DOUT from the parallel-serial converter 3, and outputs the received data to a data input/output terminal DQ. In a write operation, the data output buffer 5 receives write data through the data input/output terminal DQ, and outputs the received data to the serial-parallel converter 28 as a data input signal DIN.

The parallel-serial converter 3 outputs the parallel data output signal DB0, transmitted from the memory control unit 12, as the serial DOUT signal. The serial-parallel converter 28 converts the serial data input signal DIN transmitted from the data input buffer 26 into parallel data, and outputs the resultant as a data input signal DBI.

This embodiment includes 16 data input/output terminals DQ. Accordingly, the data output buffer 5, the data input buffer 26, the parallel-serial converter 3, and the serial-parallel converter 28 are provided for each of the terminals DQ.

The memory control unit 12 has an input/output control circuit 32. It also has other control circuits such as a timing signal generator 34 and an address decoder 36.

The memory core 14 has a memory cell array 38 in which a plurality of memory cells MC are arranged in matrix. Each memory cell MC is connected with a word line WL and a bit line BL (/BL). The memory core 14 also has control circuits such as a sense amplifier 40 and a precharging circuit 42 for bit lines.

Figure 5:
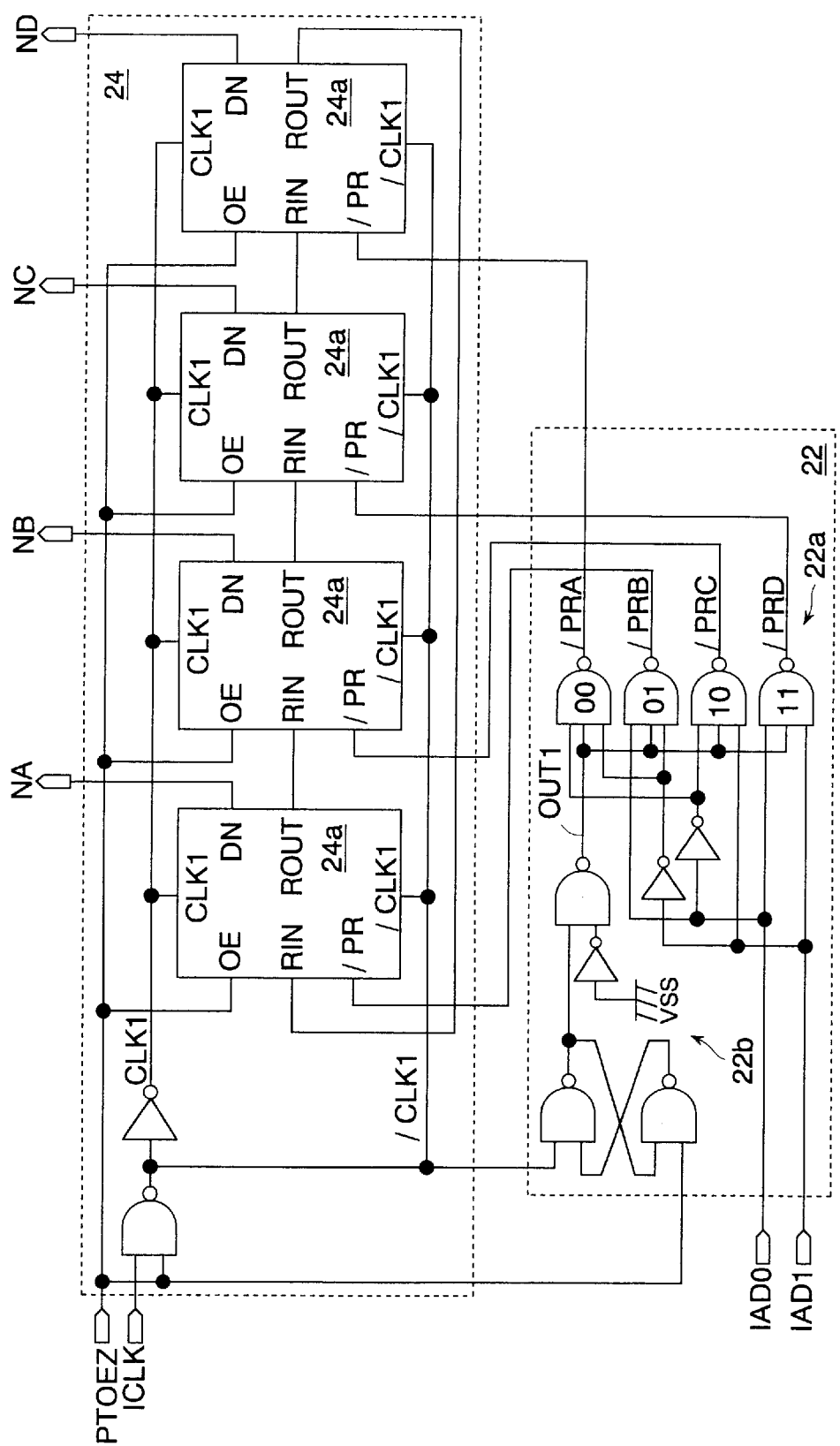
FIG. 5 is a circuit diagram showing the details of the address decoder and the shift register in FIG. 3.

FIG. 5 shows the details of the address decoder 22 and the shift register 24.

The address decoder 22 is constructed of a decoding circuit 22a and a control circuit 22b for controlling this decoding circuit 22a.

The decoding circuit 22a is constructed of four NAND gates and two inverters. The decoding circuit 22a is activated when the output OUT1 of the control circuit 22b is at high level. The decoding circuit 22a turns only the preset signal /PRA to low level when the IAD1 and IAD0 signals are "00." Likewise, the IAD1 and IAD0 signals of "01," "10," and "11" turn only the preset signals /PRB,/PRC, and /PRD to low level, respectively.

The control circuit 22b is constituted of an RS flip-flop and a buffer for receiving the output of this flip-flop. The output OUT1 of the control circuit 22b is set at high level under the low level of the PTOEZ signal, and then turned to low level in response to the low level of the /ICLK signal.

The shift register 24 is constituted of the four memory stages 24a mentioned above, along with an NAND gate and an inverter for generating the /CLK1 and CLK1 signals from the ICLK signal when the PTOEZ signal is at high level.

The memory stages 24a each have internal clock terminals CLK1 and /CLK1, a read control terminal OE, an input terminal RIN, a preset terminal /PR, an output terminal ROUT, and a data output terminal DN. Those input terminals receive the CLK1 signal, the /CLK1 signal, the PTOEZ signal, the output signal of the prior stage, and the preset signal /PRB (/PRC,/PRD, or /PRA), respectively. Those output terminals output the output signal to the subsequent stage and the connecting signal NA (NB, NC, or ND), respectively. In other words, the /PRA signal is supplied to the final stage, the /PRB signal is to the initial stage, the /PRC signal is to the second stage, and the /PRD signal is to the third stage.

Figure 6:
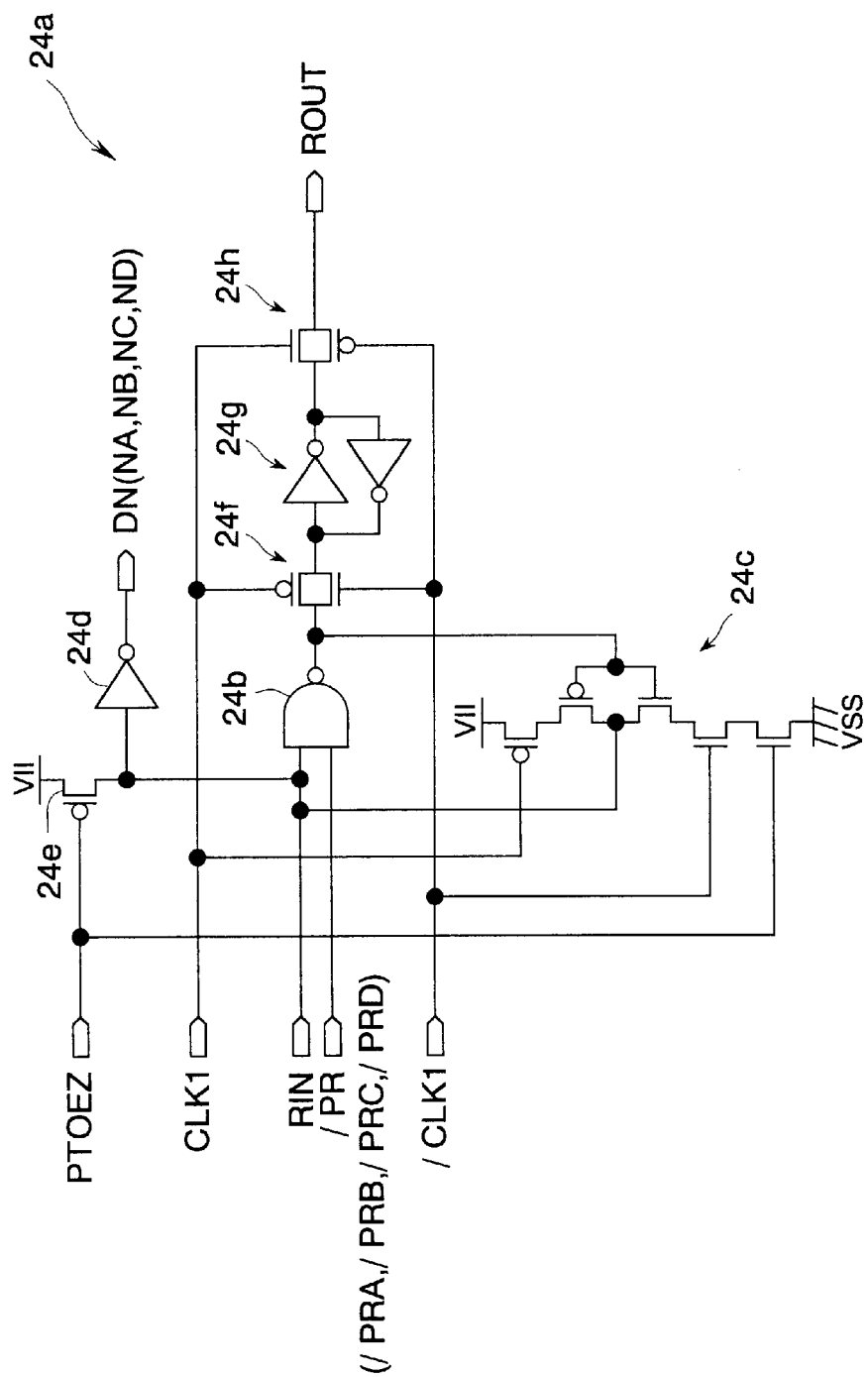
FIG. 6 is a circuit diagram showing the details of a memory stage in FIG. 5.

FIG. 6 shows the details of a memory stage 24a.

A memory stage 24a is constructed of: a NAND gate 24b for receiving the input terminal RIN and the preset terminal /PR; a clocked inverter 24c for making feedback on the output of the NAND gate 24b; an inverter 24d for transmitting the output of the clocked inverter 24c to the data output terminal DN; a pMOS transistor 24e connected to the input node of the inverter 24d; and a CMOS transmission gate 24f, a latch 24g, and a CMOS transmission gate 24h for transmitting the output signal of the NAND gate 24b to the output terminal ROUT.

The clocked inverter 24c is activated when the CLK1 signal is at low level, the /CLK1 signal is at high level, and the PTOEZ signal is at high level. The pMOS transistor 24e receives the PTOEZ signal at its gate and a supply voltage VII at its source. The CMOS transmission gates 24f and 24h are turned on when the CLK1 signal is at low level and high level, respectively. The latch 24g is formed of two inverters having their inputs and outputs connected to each other.

Figure 7:
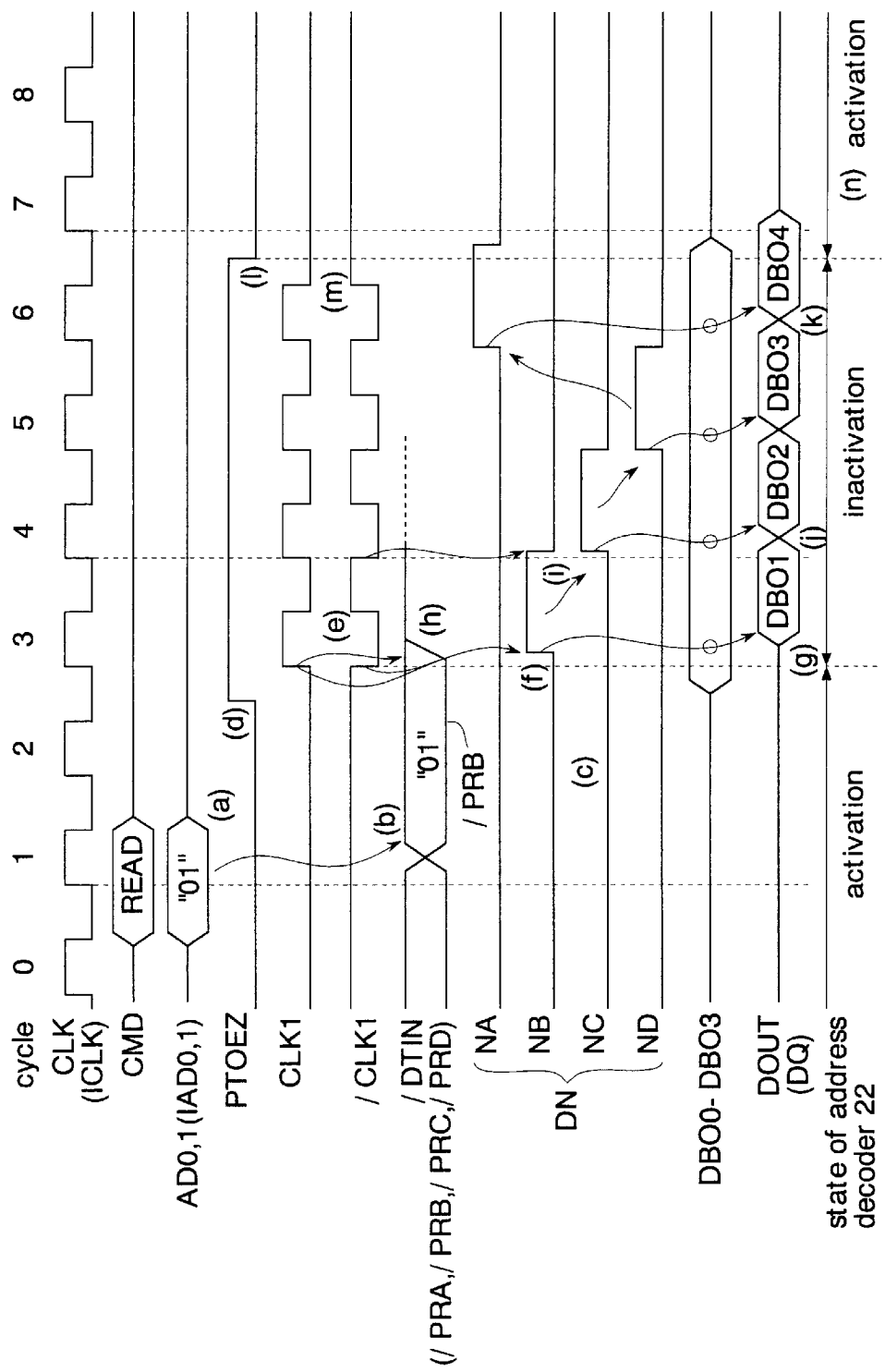
FIG. 7 is a timing chart showing a read operation in the first embodiment.

FIG. 7 shows an example of a read operation by the SDRAM described above.

Initially, the SDRAM accepts a read command and an address signal in synchronization with the rising edge of the CLK signal on the cycle 1, to start the read operation. In this example, the AD0 and AD1 signals supplied along with the read command READ are "01" in binary (FIG. 7(a)).

The address decoder 22 shown in FIG. 5 receives the low level of the PTOEZ signal to activate the decoding circuit 22a. The results of the decoding are then output as the /PRA signal, the /PRBsignal, the /PRC signal, and the PRD signal (FIG. 7(b)). In this example, only the /PRB signal is set at low level. The /PRA signal, the /PRB signal, the /PRC signal, and the /PRD signal are supplied to the preset terminals /PR of the respective memory stages 24a in the shift register 24.

Under the low level of the CLK1 signal and the high level of the /CLK1 signal, the CMOS transmission gates 24f in the memory stages 24a (FIG. 6) are turned on to hold the /PRB signal, the /PRC signal, the /PRD signal, and the /PRA signal into the respective latches 24g. In this example, among the memory stages 24a of the shift register 24, only the latch 24g of the initial stage outputs low level.

The CMOS transmission gates 24h in the respective memory stages 24a are off. The memory stages 24a receive the low level of the PTOEZ signal to turn their pMOS transistors 24e on, thereby outputting the NA, NB, NC, and ND signals of low level, respectively (FIG. 7(c)). The clocked inverters 24c in the memory stages 24a are inactivated under the low level of the CLK1 signal and the high level of the /CLK1 signal.

Then, the command decoder 20 shown in FIG. 3 analyzes the CMD command, and activates (turns to high level) the PTOEZ signal (FIG. 7(d)). Each of the memory stages 24a in the shift register 24 receives the high level of the PTOEZ signal, and turns its pMOS transistor 24e off.

The shift register 24 shown in FIG. 5 receives the activation of the PTOEZ signal, and starts generating the /CLK1 signal and the CLK1 signal (FIG. 7(e)).

The high level of the CLK1 signal and the low level of the /CLK1 signal turn the CMOS transmission gates 24f off. At the same time, the CMOS transmission gates 24h are turned on. Then, the individual memory stages 24a of the shift register receive the data held in the latches 24g of the prior stages, and output the inverted data thereof as the NA, NB, NC, and ND signals. This results in the NB signal being exclusively turned to high level on the cycle 3 (FIG. 7(f)).

Then, the switch 3a corresponding to the NB signal in the parallel-serial converter 3 shown in FIG. 4 is turned on, whereby the DB01 signal read from a memory cell is output as the DOUT signal (FIG. 7(g)). Since the DB01 signal is transmitted through a single switch 3a alone, the transmission speed is improved as compared to the conventional cases. In addition, the smaller scale of control circuits formed on the transmission path of the DB01 signal facilitates the timing design and improves the timing margin.

The address decoder 22 receives the falling edge of the /CLK1 signal, and inactivates the decoding circuit 22a so that the /PRA signal, the /PRB signal, the /PRC signal, and the /PRD signal all are turned to high level(FIG. 7(h)).

Then, on the cycle 3, the CLK1 signal falls and the /CLK1 signal rises. Each of the memory stages 24a shown in FIG. 6 turns its CMOS transmission gate 24f on and its CMOS transmission gate 24h off. Meanwhile, the clocked inverter 24c is turned on to output the NA signal (NB, NC, or ND signal) through the inverter 24d.

Next, on the cycle 4, the CLK1 signal rises and the /CLK1 signal falls. The memory stages 24a of the shift register 24 invert the data from the prior stages, and output the resultant as the NA signal, the NB signal, the NC signal, and the ND signal, respectively (FIG. 7(i)). Here, the clocked inverters 24c are off.

Then, as in the cycle 3, the DB02 signal is output as the DOUT signal (FIG. 7(j)). Subsequently, on the cycle 5 and the cycle 6, the shift register 24 makes the same operations as those described above, to output the DOUT signals (FIG. 7(k)).

After having read the successive 4-bit data, the SDRAM inactivates (turns to low level) the PTOEZ signal (FIG. 7(l)). The shift register 24 receives the inactivation of the PTOEZ signal, and stops generating the /CLK1 signal and the CLK1 signal (FIG. 7(m)). Upon receiving the low level of the PTOEZ signal, the address decoder 22 activates the decoding circuit 22a, and waits until the AD0 signal and the AD1 signal corresponding to the next write command are supplied (FIG. 7(n)).

As has been described above, in the semiconductor integrated circuit according to the present invention, the individual selections (connections) of the switches 3a in the parallel-serial converter 3 are controlled through the shift operations of the shift register 24. Therefore, with the minimum delay elements formed on the transmission paths of the parallel data output signals DB00–DB03, the parallel data can be converted into serial data of a predetermined order. This results in faster read operations of data from memory cells MC.

The serial DOUT signal converted by the parallel-serial converter 3 is output to the exterior through the data output buffer 5. This allows still faster transmission of read data when the SDRAM enters burst output mode.

The individual memory states 3a in the parallel-serial converter 3 are operated in synchronization with the CLK signal supplied from the exterior. Therefore, a clock-synchronous type SDRAM can make faster read operations.

The initial value of the shift register 24 is set in accordance with the AD1 and AD0 signals supplied from the exterior. This allows the order of serial data to be set in real time in each read operation.

The order of serial data is set in accordance with the AD1 and AD0 signals. Therefore, it is possible to convert 4-bit parallel data into serial data of a predetermined order. That is, when the SDRAM enters burst output mode, the output data can be converted into a predetermined order without any delay in access time.

The shift register 24 having the respective outputs of its memory stages 24a connected to the switches 3a are formed along with the address decoder 22 for presetting (setting the initial value of) this shift register 24. This permits control over the order of serial data with a simple circuit. The simplicity of the circuit also facilitates timing design and layout design.

Figure 8:
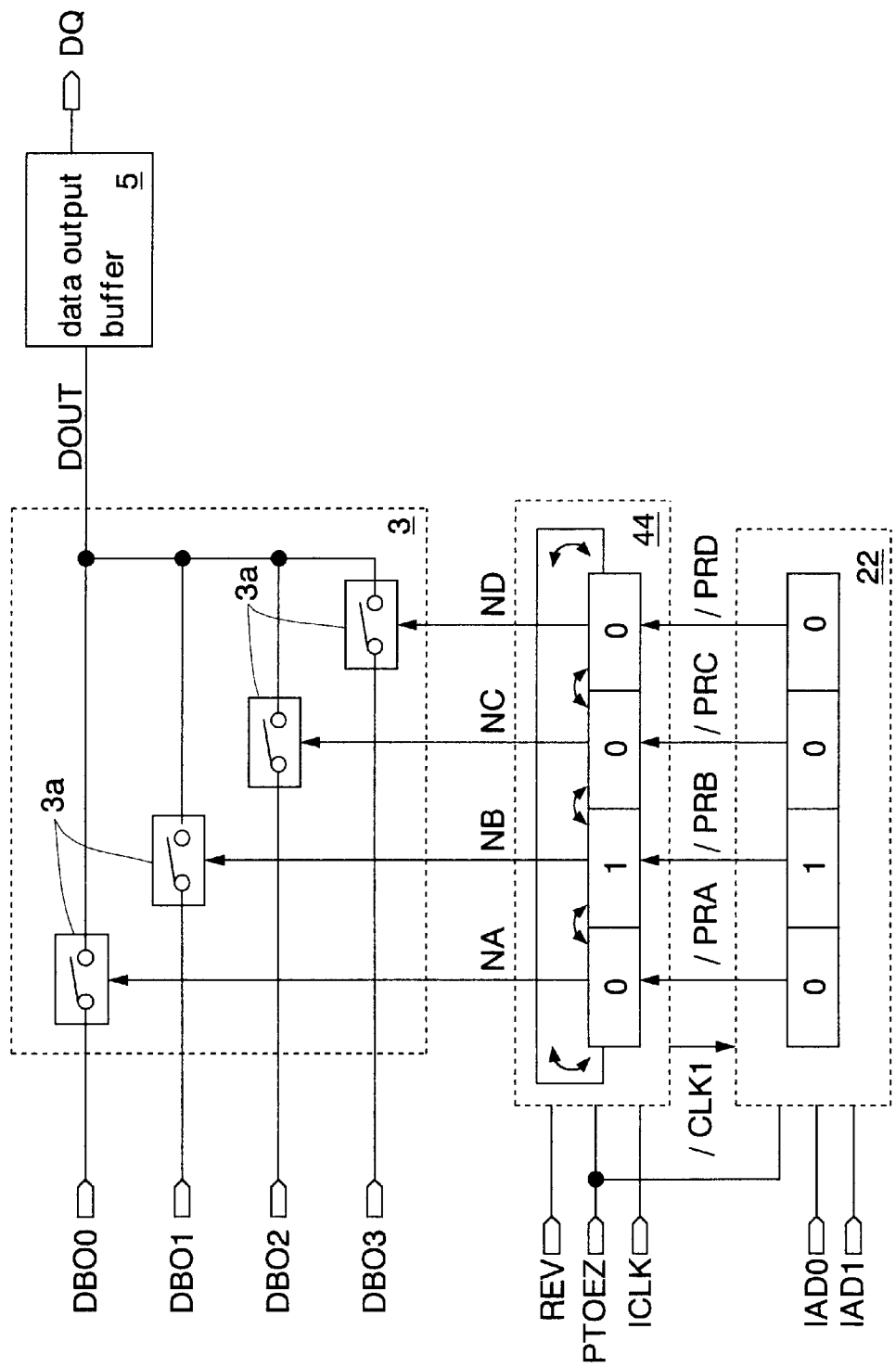
FIG. 8 is a block diagram showing the output interface unit in a second embodiment of the semiconductor integrated circuit according to the present invention.

FIG. 8 shows the output interface unit in a second embodiment of the semiconductor integrated circuit according to the present invention. Here, the same circuits as those described in the first embodiment will be designated by identical reference numbers, and detailed description thereof will be omitted.

The output interface unit of this embodiment includes a shift register 44 which is different from the shift register 24 of the first embodiment. The other configuration is identical to that of the first embodiment.

The shift register 44 has the function of switching its shift direction in accordance with an inverting signal REV. It is this shift register 44 which makes it possible to change the order of outputting read data in a burst read to meet a specification generally referred to as "interleave mode". The logic of the inverting signal REV is set by a not-shown mode register or the like.

The SDRAM of this embodiment, when the REV signal is at low level, operates as in the first embodiment. When the REV signal is at high level, the shift register 44 performs shift operations from right to left in the diagram. As a result, when the AD1 and AD0 signals of "01" are supplied in a read operation, the read data are output to the input/output terminal DQ in the order of the data output signals DBO1, DBO0, DBO3, and DBO2. That is, simply inverting the shift direction of the shift register 44 makes this SDRAM adaptable to interleave mode.

This embodiment can also offer the same effects as those obtained from the first embodiment describe above. Moreover, in this embodiment, read data can be output corresponding to the interleave mode. In the conventional interleave mode, it needs complicated switch controls over the input/output control circuit 32 shown in FIG. 3 in order to convert data. In this embodiment, the shift direction of the shift register 44 can simply be inverted for easy adaptation to the interleave mode.

In the first embodiment described above, the present invention is applied to the output interface unit 30 for outputting to the exterior the read data from memory cells MC, however, it is not limited thereto and may be applied to an input interface unit. Specifically, address decoders and shift registers can be used to change the order of converting data in the serial-parallel converter 28 so that serial write data are easily converted into predetermined parallel data. In other words, the switches of the serial-parallel converter 28 are sequentially connected to an internal node, so that a burst write operation can be performed at high speed.

In the first embodiment described above, the present invention is applied to an SDRAM, however, it is not limited thereto and may be applied to semiconductor memories such as DRAMs, SRAMs. It may also be applied to a system LSIs having DRAM memory cores implemented therein.

A semiconductor fabrication process to which the present invention is applied is not limited to the CMOS process and it may well be applied to a Bi-CMOS process.

The invention is not limited to the above embodiments and various modifications may be made without departing from the spirit and the scope of the invention. Any improvement may be made in part or all of the components.

What is claimed is:

1. A semiconductor integrated circuit comprising:

A serial-parallel converter for receiving data to be written to memory cells at a plurality of switches as serial data and selecting the switches in a predetermined order to respectively connect with internal nodes; and a switch control circuit receiving a control signal for controlling a selection order of said switches in accordance with the control signal.

2. A semiconductor integrated circuit comprising:

a serial-paraellel converter for receiving serial data written to memory cells at a plurality of switches and sequentially selecting the switches to connect with internal nodes; and a switch control circuit including a shift register in which a plurality of stages are respectively connected to said switches which correspond, in accordance with an address signal.

* * * * *